United States Patent
Odagiri et al.

(10) Patent No.: US 10,207,362 B2
(45) Date of Patent: Feb. 19, 2019

(54) LASER PROCESSING APPARATUS

(71) Applicant: DISCO CORPORATION, Tokyo (JP)

(72) Inventors: Wataru Odagiri, Tokyo (JP); Taku Iwamoto, Tokyo (JP); Kentaro Odanaka, Tokyo (JP); Hironari Ohkubo, Tokyo (JP); Shuichiro Tsukiji, Tokyo (JP); Kouichi Nehashi, Tokyo (JP); Joel Koerwer, Tokyo (JP)

(73) Assignee: Disco Corporation, Tokyo (JP)

( * ) Notice: Subject to any disclaimer, the term of this patent is extended or adjusted under 35 U.S.C. 154(b) by 399 days.

(21) Appl. No.: 15/205,603

(22) Filed: Jul. 8, 2016

(65) Prior Publication Data

US 2017/0014947 A1    Jan. 19, 2017

(30) Foreign Application Priority Data

Jul. 17, 2015    (JP) ................. 2015-143399

(51) Int. Cl.
| | |
|---|---|
| *B23K 26/03* | (2006.01) |
| *B23K 26/06* | (2014.01) |
| *B23K 26/08* | (2014.01) |
| *B23K 26/36* | (2014.01) |
| *B23K 26/402* | (2014.01) |
| *H01L 21/67* | (2006.01) |
| *H01L 21/78* | (2006.01) |

(Continued)

(52) U.S. Cl.
CPC .......... *B23K 26/032* (2013.01); *B23K 26/364* (2015.10); *B23K 26/402* (2013.01); *H01L 21/2686* (2013.01); *H01L 21/67092* (2013.01); *H01L 21/82* (2013.01); *B23K 2103/50* (2018.08); *B23K 2103/56* (2018.08); *H01L 22/12* (2013.01); *H01L 22/26* (2013.01)

(58) Field of Classification Search
CPC ........ B23K 26/03; B23K 26/06; B23K 26/08; B23K 26/36; B23K 26/40; H01L 21/67; H01L 21/78; H01L 21/26
USPC ...................................... 219/121.62, 121.68
See application file for complete search history.

(56) References Cited

U.S. PATENT DOCUMENTS

| | | | |
|---|---|---|---|
| 6,563,998 B1 * | 5/2003 | Farah | G02B 6/138 |
| | | | 385/131 |
| 2009/0321399 A1 * | 12/2009 | Inagawa | B23K 26/0673 |
| | | | 219/121.69 |

(Continued)

FOREIGN PATENT DOCUMENTS

JP    2006-253432    9/2006

*Primary Examiner* — Samuel M Heinrich
(74) *Attorney, Agent, or Firm* — Greer Burns & Crain Ltd.

(57) ABSTRACT

A laser beam irradiation unit of laser processing apparatus includes a pulse laser beam oscillating unit, a condenser that condenses a pulse laser beam and emits the beam to a workpiece held by a chuck table, a dichroic mirror disposed between the pulse laser beam oscillating unit and the condenser, a strobe light irradiation unit that emits light to a path on which the dichroic mirror and the condenser are disposed, a beam splitter disposed between the strobe light irradiation unit and the dichroic mirror, and an imaging unit disposed on the path of light split by the beam splitter. A controller actuates the strobe light irradiation unit and the imaging unit according to the timing of the pulse laser beam, and detects the width of a laser-processed groove immediately after emission of the pulse laser beam on the basis of an image signal from the imaging unit.

4 Claims, 7 Drawing Sheets

(51) Int. Cl.
*H01L 21/26* (2006.01)
*B23K 26/364* (2014.01)
*H01L 21/268* (2006.01)
*H01L 21/82* (2006.01)
*B23K 103/00* (2006.01)
*H01L 21/66* (2006.01)

(56) References Cited

U.S. PATENT DOCUMENTS

| | | | | |
|---|---|---|---|---|
| 2010/0252543 | A1* | 10/2010 | Manens | B23K 26/702 |
| | | | | 219/121.69 |
| 2011/0127697 | A1* | 6/2011 | Milne | B23K 26/046 |
| | | | | 264/400 |
| 2011/0136265 | A1* | 6/2011 | Shigenobu | H01L 31/208 |
| | | | | 438/4 |
| 2012/0273472 | A1* | 11/2012 | Unrath | B23K 26/0732 |
| | | | | 219/121.73 |

\* cited by examiner

LASER PROCESSING APPARATUS

BACKGROUND OF THE INVENTION

Field of the Invention

The present invention relates to a laser processing apparatus that carries out laser processing for a workpiece such as a semiconductor wafer held by a chuck table.

Description of the Related Art

In a semiconductor device manufacturing process, plural regions are marked out by planned dividing lines arranged in a lattice manner on a surface of a semiconductor wafer having a substantially circular disc shape and devices such as integrated circuits (ICs) and large-scale integrations (LSIs) are formed in these marked-out regions. Then, by cutting the semiconductor wafer along the planned dividing lines, the regions in which the devices are formed are divided to manufacture individual semiconductor device chips.

As a method for dividing the wafer such as the semiconductor wafer along the planned dividing lines, the following technique has been put into practical use. Specifically, the wafer is irradiated with a pulse laser beam having such a wavelength as to be absorbed by the wafer along the planned dividing lines to carry out ablation processing and form laser-processed grooves. Then, the wafer is split by giving an external force to the wafer along the planned dividing lines along which the laser-processed grooves serving as the origin of breakage are formed.

A laser processing apparatus that carries out the above-described laser processing includes a chuck table that holds the workpiece, laser beam irradiating means that irradiates the workpiece held by this chuck table with a laser beam, moving means that moves the chuck table and the laser beam irradiating means relatively, and alignment means that detects the region in which processing should be carried out in the workpiece held by the chuck table (for example, refer to Japanese Patent Laid-open No. 2006-253432).

SUMMARY OF THE INVENTION

However, there is a problem that the width of the laser-processed groove becomes larger or smaller and it becomes impossible to carry out desired processing for the workpiece if the output power of the laser beam emitted by the laser beam irradiating means changes or distortion arises in an optical system.

Thus, an object of the present invention is to provide a laser processing apparatus that can monitor change in the width of the laser-processed groove, caused by change in the output power of a laser beam emitted by laser beam irradiating means or the arising of distortion in an optical system.

In accordance with an aspect of the present invention, there is provided a laser processing apparatus including a chuck table that holds a workpiece, laser beam irradiating means that irradiates the workpiece held by the chuck table with a pulse laser beam, X-axis direction moving means that moves the chuck table and the laser beam irradiating means relatively in an X-axis direction that is a processing feed direction, Y-axis direction moving means that moves the chuck table and the laser beam irradiating means relatively in a Y-axis direction that is an indexing feed direction orthogonal to the X-axis direction, and control means that controls the laser beam irradiating means, the X-axis direction moving means, and the Y-axis direction moving means. The laser beam irradiating means includes pulse laser beam oscillating means that oscillates the pulse laser beam, a condenser that condenses the pulse laser beam oscillated from the pulse laser beam oscillating means and emits the pulse laser beam to the workpiece held by the chuck table, and a dichroic mirror that is disposed between the pulse laser beam oscillating means and the condenser and reflects the pulse laser beam oscillated from the pulse laser beam oscillating means to lead the pulse laser beam to the condenser. The dichroic mirror allows transmission of light having a wavelength other than the wavelength of the pulse laser beam through the dichroic mirror. The laser beam irradiating means further includes strobe light irradiating means that emits light to a path on which the dichroic mirror and the condenser are disposed, a beam splitter that is disposed between the strobe light irradiating means and the dichroic mirror and splits light from the workpiece held by the chuck table, and imaging means disposed on a path of light split by the beam splitter. The control means actuates the strobe light irradiating means and the imaging means according to the timing of the pulse laser beam that is oscillated by the pulse laser beam oscillating means and is emitted to the workpiece held by the chuck table, and detects the width of a laser-processed groove immediately after emission of the pulse laser beam on the basis of an image signal from the imaging means.

Preferably, the control means stops actuation of the laser beam irradiating means to suspend processing if the detected width of the laser-processed groove is outside an allowable range.

Furthermore, the control means detects, on the basis of an image signal from the imaging means, the amount of deviation between a set value of Y-axis direction distance from a target that is set on the workpiece and is to identify a region in which processing should be carried out to the center of a laser-processed groove to be formed and Y-axis direction distance to the center of a laser-processed groove formed by irradiation with the pulse laser beam.

Preferably, the control means controls the Y-axis direction moving means to correct a position irradiated with the pulse laser beam if the amount of deviation between the set value and the Y-axis direction distance to the center of the laser-processed groove formed by irradiation with the pulse laser beam surpasses an allowable value.

According to the laser processing apparatus of the present invention, the control means actuates the strobe light irradiating means and the imaging means according to the timing of the pulse laser beam emitted to the workpiece, and detects the width of the laser-processed groove immediately after the emission of the pulse laser beam on the basis of the image signal from the imaging means. Thus, in the case in which the width of the laser-processed groove becomes larger or smaller due to change in the output power of the pulse laser beam or the arising of distortion in the optical system, it is possible to detect the abnormality of the laser-processed groove in real time and respond to the abnormality through e.g. suspending abnormal processing causing the lowering of the quality.

Furthermore, the control means detects, on the basis of the image signal from the imaging means, the amount of deviation between the set value of the Y-axis direction distance from the target that is set on the workpiece and is to identify the region in which processing should be carried out to the center of the laser-processed groove to be formed and the Y-axis direction distance to the center of the laser-processed groove formed by irradiation with the pulse laser beam. In addition, the control means controls the Y-axis direction moving means to correct the position irradiated with the pulse laser beam if the amount of deviation between the set value and the Y-axis direction distance to the center of the laser-processed groove formed by irradiation with the pulse laser beam surpasses the allowable value. This can keep desired laser processing.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
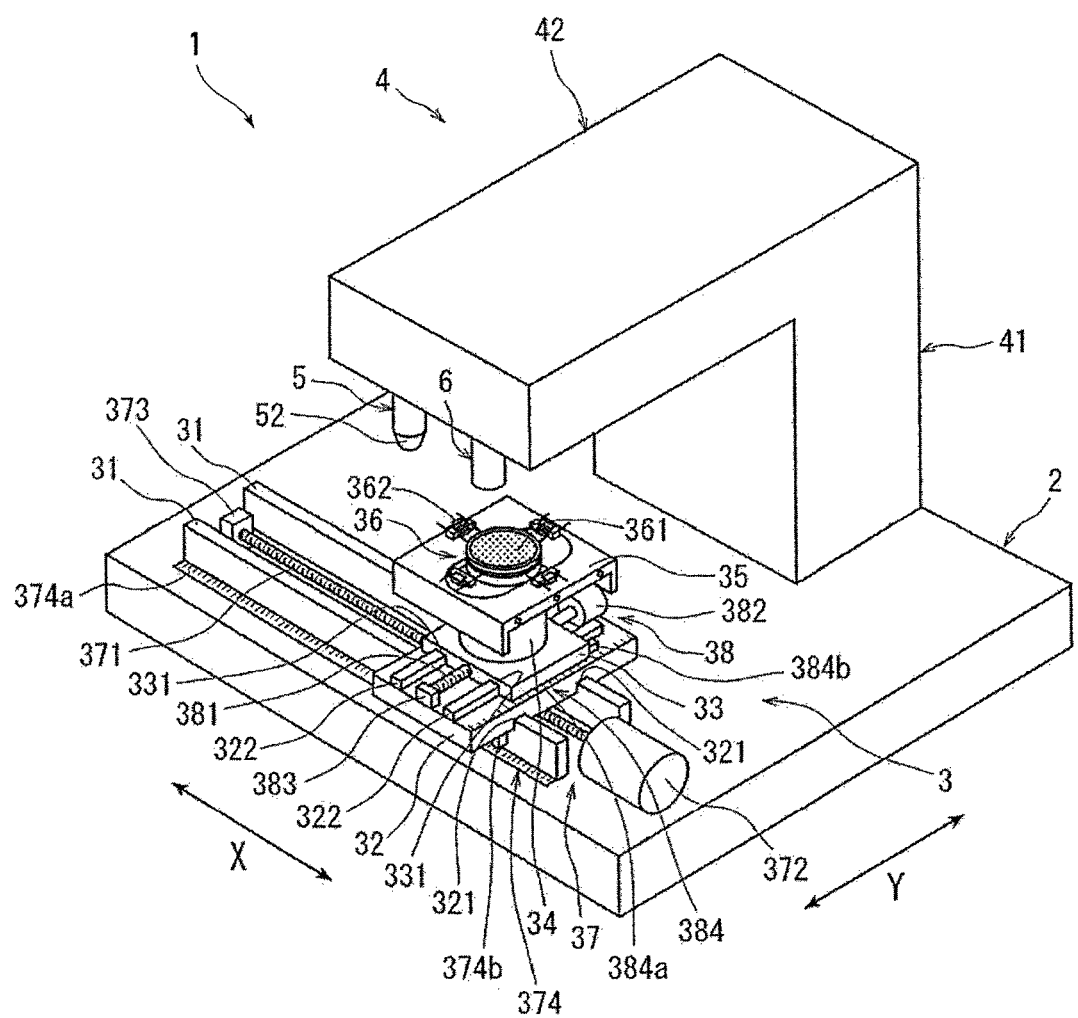
FIG. 1 is a perspective view of a laser processing apparatus configured in accordance with the present invention.

Preferred embodiments of a laser processing apparatus configured in accordance with the present invention will be described in detail below with reference to the accompanying drawings. In FIG. 1, a perspective view of the laser processing apparatus configured in accordance with the present invention is depicted. A laser processing apparatus 1 depicted in FIG. 1 includes a stationary base 2, a chuck table mechanism 3 that is disposed on this stationary base 2 movably in an X-axis direction that is the processing feed direction depicted by an arrow X and holds a workpiece, and a laser beam irradiation unit 4 as laser beam irradiating means disposed over the base 2.

The above-described chuck table mechanism 3 includes the following components: a pair of guide rails 31 disposed in parallel along the X-axis direction on the stationary base 2; a first slide block 32 disposed on these guide rails 31 movably in the X-axis direction; a second slide block 33 disposed over this first slide block 32 movably in a Y-axis direction that is orthogonal to the X-axis direction and is the indexing feed direction depicted by an arrow Y; a support table 35 supported by a circular cylindrical member 34 over this second slide block 33; and a chuck table 36 as workpiece holding means. This chuck table 36 includes an adsorption chuck 361 formed from a porous material and e.g. a semiconductor wafer having a circular shape as a workpiece is held on a holding surface that is the upper surface of the adsorption chuck 361 by suction means (not depicted). The chuck table 36 configured in this manner is rotated by a pulse motor (not depicted) disposed in the circular cylindrical member 34. Around the chuck table 36, clamps 362 for fixing a ring-shaped frame that supports the workpiece such as the semiconductor wafer with the intermediary of a protective tape are disposed.

In the lower surface of the first slide block 32, a pair of guided grooves 321 fitted to the pair of guide rails 31 are made. In addition, a pair of guide rails 322 formed in parallel along the Y-axis direction are provided on the upper surface of the first slide block 32. The first slide block 32 formed in this manner is configured to be allowed to move in the X-axis direction along the pair of guide rails 31 by the fitting of the guided grooves 321 to the pair of guide rails 31. The chuck table mechanism 3 includes X-axis direction moving means 37 for moving the first slide block 32 in the X-axis direction along the pair of guide rails 31. The X-axis direction moving means 37 includes a male screw rod 371 disposed between the pair of guide rails 31 in parallel and a drive source such as a pulse motor 372 for rotationally driving this male screw rod 371. One end of the male screw rod 371 is rotatably supported by a bearing block 373 fixed to the stationary base 2 and the other end thereof is joined to the output shaft of the pulse motor 372 for power transmission. The male screw rod 371 is screwed to a penetrating female screw hole formed in a female screw block (not depicted) provided on the lower surface of the central part of the first slide block 32 in a protruding manner. Therefore, by driving the male screw rod 371 for the forward rotation and reverse rotation thereof by the pulse motor 372, the first slide block 32 is moved in the X-axis direction along the guide rails 31.

The laser processing apparatus 1 includes X-axis direction position detecting means 374 for detecting the X-axis direction position of the chuck table 36. The X-axis direction position detecting means 374 includes a linear scale 374a disposed along the guide rail 31 and a reading head 374b that is disposed on the first slide block 32 and moves along the linear scale 374a together with the first slide block 32. The reading head 374b of this X-axis direction position detecting means 374 sends, at every 1 μm, a pulse signal of one pulse to control means to be described later in the present embodiment. Furthermore, the control means to be described later detects the X-axis direction position of the chuck table 36 by counting the input pulse signal. If the pulse motor 372 is used as the drive source of the X-axis direction moving means 37, it is also possible to detect the X-axis direction position of the chuck table 36 by counting a drive pulse of the control means to be described later that outputs a drive signal to the pulse motor 372. Furthermore, if a servomotor is used as the drive source of the X-axis direction moving means 37, it is also possible to detect the X-axis direction position of the chuck table 36 by sending a pulse signal output by a rotary encoder that detects the rotation speed of the servomotor to the control means to be described later and counting the input pulse signal by the control means.

In the lower surface of the second slide block 33, a pair of guided grooves 331 fitted to the pair of guide rails 322 provided on the upper surface of the first slide block 32 are provided. The second slide block 33 is configured to be allowed to move in the Y-axis direction by fitting these guided grooves 331 to the pair of guide rails 322. The chuck table mechanism 3 includes Y-axis direction moving means 38 for moving the second slide block 33 in the Y-axis direction along the pair of guide rails 322 provided on the first slide block 32. The Y-axis direction moving means 38 includes a male screw rod 381 disposed between the pair of guide rails 322 in parallel and a drive source such as a pulse motor 382 for rotationally driving this male screw rod 381. One end of the male screw rod 381 is rotatably supported by a bearing block 383 fixed to the upper surface of the first slide block 32 and the other end is joined to the output shaft of the pulse motor 382 for power transmission. The male screw rod 381 is screwed to a penetrating female screw hole formed in a female screw block (not depicted) provided on the lower surface of the central part of the second slide block 33 in a protruding manner. Therefore, by driving the male screw rod 381 for the forward rotation and reverse rotation thereof by the pulse motor 382, the second slide block 33 is moved in the Y-axis direction along the guide rails 322.

The laser processing apparatus 1 includes Y-axis direction position detecting means 384 for detecting the Y-axis direction position of the second slide block 33. The Y-axis direction position detecting means 384 includes a linear scale 384a disposed along the guide rail 322 and a reading head 384b that is disposed on the second slide block 33 and moves along the linear scale 384a together with the second slide block 33. The reading head 384b of this Y-axis direction position detecting means 384 sends, at every 1 μm, a pulse signal of one pulse to the control means to be described later in the present embodiment. Furthermore, the control means to be described later detects the Y-axis direction position of the chuck table 36 by counting the input pulse signal. If the pulse motor 382 is used as the drive source of the Y-axis direction moving means 38, it is also possible to detect the Y-axis direction position of the chuck table 36 by counting a drive pulse of the control means to be described later that outputs a drive signal to the pulse motor 382. Furthermore, if a servomotor is used as the drive source of the Y-axis direction moving means 38, it is also possible to detect the Y-axis direction position of the chuck table 36 by sending a pulse signal output by a rotary encoder that detects the rotation speed of the servomotor to the control means to be described later and counting the input pulse signal by the control means.

The laser beam irradiation unit 4 includes a support member 41 disposed on the base 2, a casing 42 that is supported by this support member 41 and horizontally extends substantially, laser beam irradiating means 5 disposed on this casing 42, and alignment means 6 that is disposed at the front end part of the casing 42 and detects a processing region in which laser processing should be carried out. The alignment means 6 includes illuminating means that illuminates a workpiece, an optical system that captures the region illuminated by this illuminating means, an imaging element (CCD: charge-coupled device) that takes an image captured by this optical system, and so forth. The alignment means 6 sends an image signal obtained by the imaging to the control means to be described later.

Figure 2:
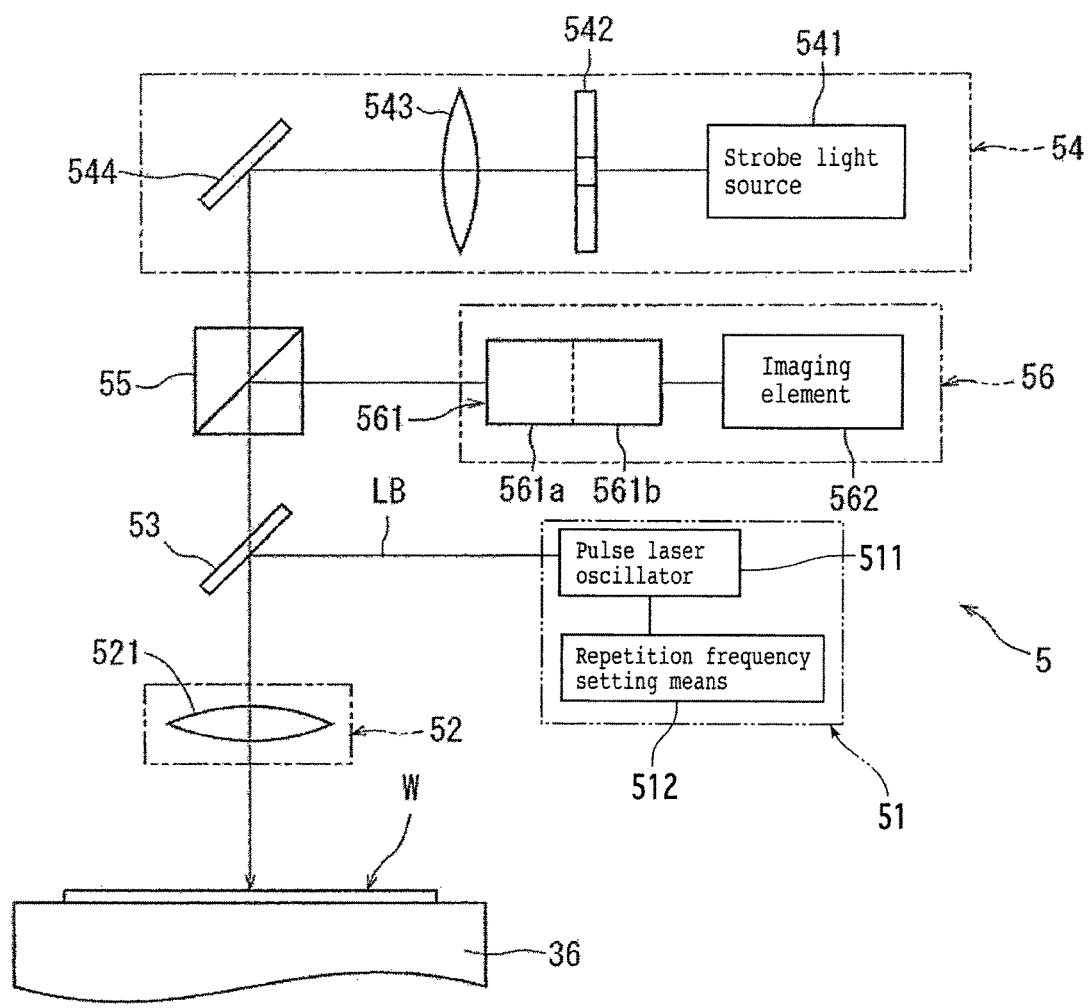
FIG. 2 is a block configuration diagram of laser beam irradiating means with which the laser processing apparatus depicted in FIG. 1 is equipped.

The laser beam irradiating means 5 will be described with reference to FIG. 2. The laser beam irradiating means 5 includes pulse laser beam oscillating means 51, a condenser 52 that condenses a pulse laser beam oscillated from this pulse laser beam oscillating means 51 and irradiates a workpiece W held by the chuck table 36 with the pulse laser beam, and a dichroic mirror 53 that is disposed between the pulse laser beam oscillating means 51 and the condenser 52 and leads the pulse laser beam oscillated from the pulse laser beam oscillating means 51 to the condenser 52. The pulse laser beam oscillating means 51 includes a pulse laser oscillator 511 and repetition frequency setting means 512 annexed thereto. The pulse laser oscillator 511 of the pulse laser beam oscillating means 51 oscillates a pulse laser beam LB having a wavelength of 355 nm in the present embodiment. The condenser 52 includes a collecting lens 521 that condenses the pulse laser beam LB oscillated from the pulse laser beam oscillating means 51. The dichroic mirror 53 disposed between the pulse laser beam oscillating means 51 and the condenser 52 has functions of reflecting the pulse laser beam LB oscillated from the pulse laser beam oscillating means 51 to lead the pulse laser beam LB to the condenser 52 and allowing transmission of light having a wavelength other than the wavelength of the pulse laser beam LB (355 nm, in the present embodiment) through the dichroic mirror 53.

The laser beam irradiating means 5 includes strobe light irradiating means 54 that emits light to the path of the dichroic mirror 53 and the condenser 52, a beam splitter 55 that is disposed between this strobe light irradiating means 54 and the dichroic mirror 53 and splits light from the workpiece W held by the chuck table 36, and imaging means 56 disposed on the path of light split by this beam splitter 55. The strobe light irradiating means 54 includes the following components: a strobe light source 541 that is formed of a xenon flash lamp and emits white light; a diaphragm 542 that defines the size of the field of view of the white light emitted from this strobe light source 541; a lens 543 for collecting the white light that has passed through this diaphragm 542 onto the workpiece W held by the chuck table 36; and a direction conversion mirror 544 that converts the direction of the white light collected by this lens 543 toward the beam splitter 55.

The beam splitter 55 leads the white light led by the direction conversion mirror 544 of the strobe light irradiating means 54 to the dichroic mirror 53 and splits light from the workpiece W held by the chuck table 36 toward the imaging means 56. The imaging means 56 is formed of a compound lens 561 including an aberration correction lens 561a and an image forming lens 561b and an imaging element (CCD) 562 that takes an image captured by this compound lens 561. The imaging means 56 sends an image signal obtained by the imaging to the control means to be described later.

Figure 3:
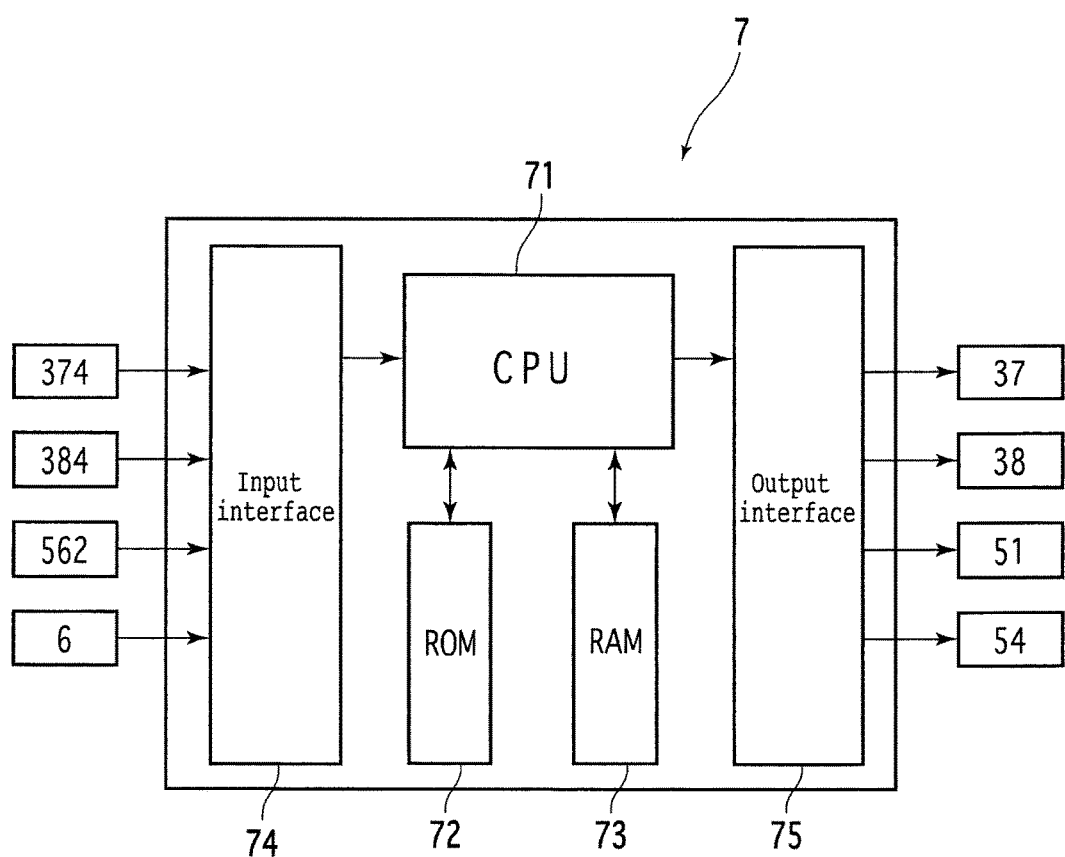
FIG. 3 is a block configuration diagram of control means with which the laser processing apparatus depicted in FIG. 1 is equipped.

The laser processing apparatus 1 includes control means 7 depicted in FIG. 3. The control means 7 is formed of a computer and includes a central processing unit (CPU) 71 that executes arithmetic processing in accordance with a control program, a read only memory (ROM) 72 that stores the control program and so forth, a random access memory (RAM) 73 that stores arithmetic results and so forth and is readable and writable, an input interface 74, and an output interface 75. To the input interface 74 of the control means 7, detection signals from the X-axis direction position detecting means 374, the Y-axis direction position detecting means 384, the imaging element (CCD) 562 of the imaging means 56, the alignment means 6, and so forth are input. Furthermore, from the output interface 75 of the control means 7, control signals are output to the X-axis direction moving means 37, the Y-axis direction moving means 38, the pulse laser beam oscillating means 51 of the laser beam irradiating means 5, the strobe light irradiating means 54, and so forth.

Figure 4:
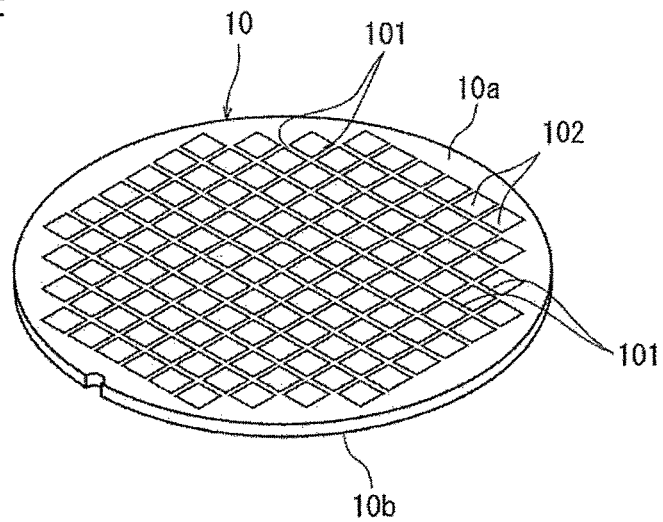
FIG. 4 is a perspective view of a semiconductor wafer.

The laser processing apparatus 1 is configured in the above-described manner and the operation thereof will be described below. FIG. 4 depicts a perspective view of a semiconductor wafer 10 as a workpiece to be processed by the above-described laser processing apparatus 1. The semiconductor wafer 10 depicted in FIG. 4 is formed of a silicon wafer. Plural planned dividing lines 101 are formed in a lattice manner on a front surface 10a. In addition, devices 102 such as ICs and LSIs are formed in plural regions marked out by these plural planned dividing lines 101.

Figure 5:
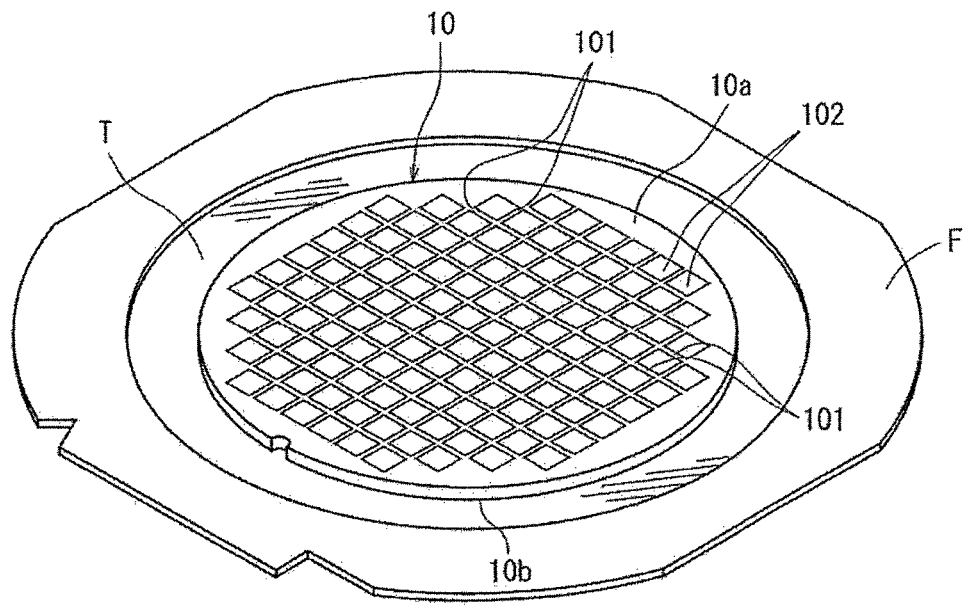
FIG. 5 is a perspective view depicting the state in which the semiconductor wafer depicted in FIG. 4 is stuck to a surface of a dicing tape mounted to a ring-shaped frame.

In order to divide the above-described semiconductor wafer 10 along the planned dividing lines 101, first a workpiece supporting step of sticking a surface of an adhesive tape made of a synthetic resin to a back surface 10b of the semiconductor wafer 10 and supporting the circumferential part of the adhesive tape by a ring-shaped frame is carried out. Specifically, as depicted in FIG. 5, the back surface 10b of the semiconductor wafer 10 is stuck to the surface of an adhesive tape T whose circumferential part is mounted to cover the inside opening of a ring-shaped frame F. The adhesive tape T is made of a polyvinyl chloride (PVC) sheet in the present embodiment.

After the above-described wafer supporting step is carried out, the side of the adhesive tape T of the semiconductor wafer 10 is placed on the chuck table 36 of the laser processing apparatus depicted in FIG. 1. Then, by actuating suction means (not depicted), the semiconductor wafer 10 is held over the chuck table 36 by suction with the intermediary of the adhesive tape T (workpiece holding step). The ring-shaped frame F that supports the semiconductor wafer 10 with the intermediary of the adhesive tape T is fixed by the clamps 362 disposed around the chuck table 36.

After the above-described workpiece holding step is carried out, the X-axis direction moving means 37 is actuated to position the chuck table 36 that holds the semiconductor wafer 10 by suction directly under the alignment means 6. When the chuck table 36 is positioned directly under the alignment means 6, alignment work of detecting a processing region in which laser processing should be carried out on the semiconductor wafer 10 is carried out by the alignment means 6 and the control means 7. Specifically, the alignment means 6 and the control means 7 execute image processing such as pattern matching for position adjustment with respect to the condenser 52 of the laser beam irradiating means 5 that irradiates the semiconductor wafer 10 with a laser beam along the planned dividing lines 101 formed along a first direction of the semiconductor wafer 10 and accomplish alignment of the laser beam irradiation position. Furthermore, alignment of the laser beam irradiation position is similarly accomplished also regarding the planned dividing lines 101 formed on the semiconductor wafer 10 along a second direction orthogonal to the first direction.

Figure 6A:
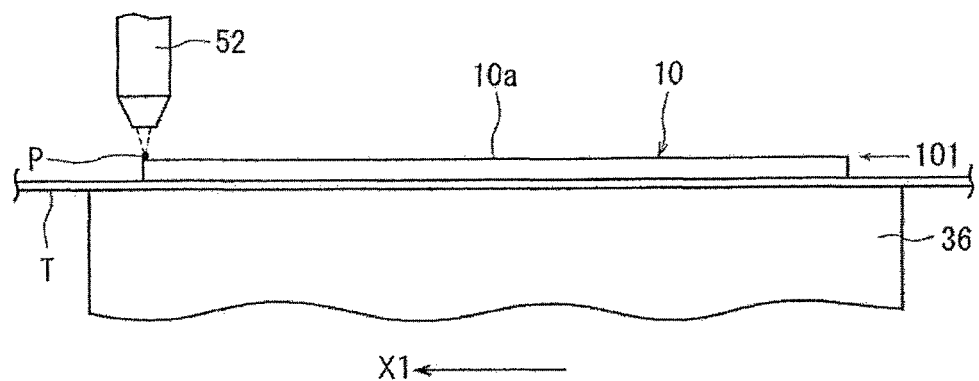
FIG. 6A to FIG. 6C are explanatory diagrams of a laser processing step carried out by the laser processing apparatus depicted in FIG. 1.
Figure 6B:
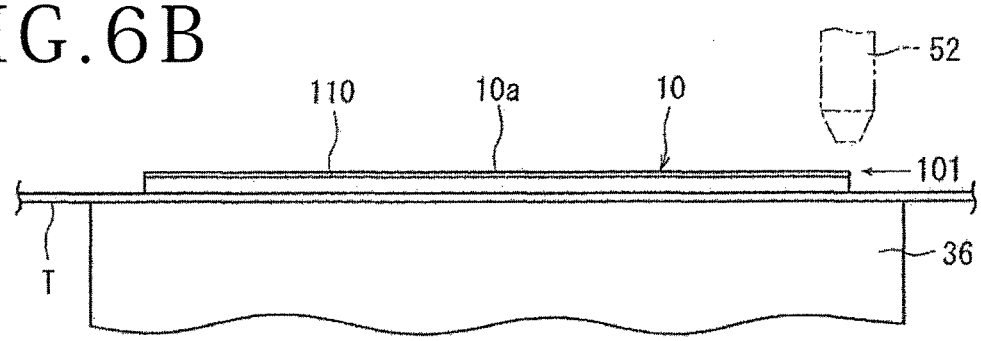
Figure 6C:
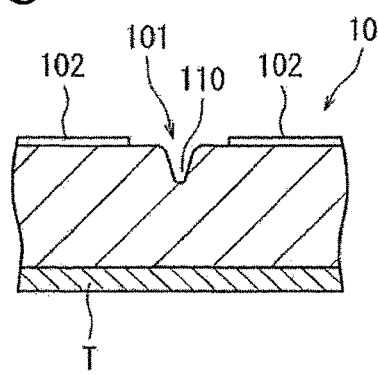

After the planned dividing lines formed on the semiconductor wafer 10 held on the chuck table 36 are detected and the alignment of the laser beam irradiation position is carried out in the above-described manner, as depicted in FIG. 6A, the chuck table 36 is moved to the laser beam irradiation region above which the condenser 52 of the laser beam irradiating means 5 is located and one end (left end in FIG. 6A) of the predetermined planned dividing line 101 is positioned directly under the condenser 52. Then, a light focus point P of a pulse laser beam emitted from the condenser 52 is positioned in the vicinity of a front surface (upper surface) 10a of the semiconductor wafer 10. Next, the chuck table 36 is moved in a direction indicated by an arrow X1 in FIG. 6A at a predetermined movement speed while the pulse laser beam having such a wavelength as to be absorbed by the semiconductor wafer 10 (355 nm, in the present embodiment) is emitted from the condenser 52 of the laser beam irradiating means 5. Then, when the other end (right end in FIG. 6B) of the planned dividing line 101 reaches the position directly under the condenser 52, the emission of the pulse laser beam is stopped and the movement of the chuck table 36 is stopped. As a result, a laser-processed groove 110 is formed in the semiconductor wafer 10 along the planned dividing line 101 as depicted in FIG. 6B and FIG. 6C (laser processing step).

The laser processing condition of the above-described laser processing step is set as follows for example.

Light source of laser beam: YVO4 laser or YAG laser
Wavelength: 355 nm
Repetition frequency: 50 kHz
Average output power: 3 W
Light focus spot diameter: 10 μm
Processing feed speed: 100 mm/second There is the following problem. Specifically, if the output power of the pulse laser beam emitted from the condenser 52 of the laser beam irradiating means 5 changes or distortion arises in the optical system from the pulse laser beam oscillating means 51 to the condenser 52 when the above-described laser processing step is being carried out, the width of the laser-processed groove becomes larger or smaller and it becomes impossible to carry out desired laser processing for the semiconductor wafer 10 as the workpiece. To address this problem, in the laser processing apparatus in the present embodiment, change in the width of the laser-processed groove caused by the change in the output power of the pulse laser beam emitted from the condenser 52 of the laser beam irradiating means 5 or the arising of distortion in the optical system is monitored. Specifically, the strobe light irradiating means 54 is actuated to irradiate the pulse laser beam irradiated region in the semiconductor wafer 10 with white light according to the irradiation timing of the pulse laser beam that is oscillated from the pulse laser beam oscillating means 51 of the laser beam irradiating means 5 and is emitted from the condenser 52 to the semiconductor wafer 10 held by the chuck table 36. Then, light from the semiconductor wafer 10 is imaged by the imaging means 56 and an image signal obtained by the imaging is sent to the control means 7. Thereby, the control means 7 detects the width of the laser-processed groove formed by the irradiation with the pulse laser beam on the basis of the image signal sent from the imaging element (CCD) 562 of the imaging means 56. In addition, the control means 7 detects the deviation between the position irradiated with the pulse laser beam and the position at which the processing should be carried out (laser-processed groove monitoring step).

Figure 7:
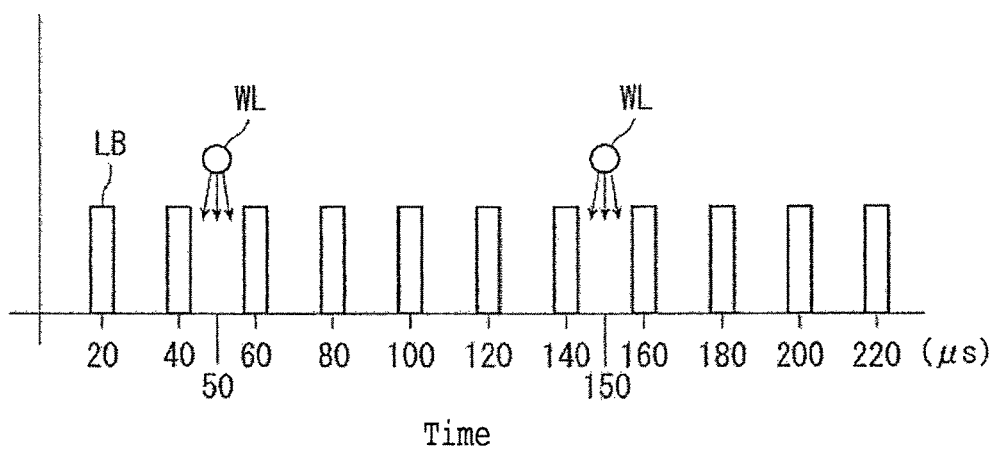
FIG. 7 is an explanatory diagram depicting the timing of a pulse laser beam emitted by the laser beam irradiating means and light emitted by strobe light irradiating means.

The above-described laser-processed groove monitoring step will be described in more detail with reference to FIG. 7. In the present embodiment, the repetition frequency of the pulse laser beam oscillated from the pulse laser beam oscillating means 51 of the laser beam irradiating means 5 is 50 kHz. Thus, one pulse of the pulse laser beam LB is emitted to the semiconductor wafer 10 held by the chuck table 36 every 20 microseconds. In order to detect the irradiation position of the pulse laser beam emitted to the semiconductor wafer 10 held by the chuck table 36 in this manner and the width of the laser-processed groove 110 formed in the semiconductor wafer 10 by the irradiation with the pulse laser beam, the control means 7 actuates the strobe light source 541 of the strobe light irradiating means 54. As the timing when this strobe light source 541 is actuated, it is so actuated that white light is emitted between the pulse laser beam LB and the other pulse laser beam LB so that the white light may be prevented from overlapping with the pulse laser beam LB. Specifically, in the present embodiment, the actuation timing is so set that, as depicted in FIG. 7, the first actuation timing is 50 microseconds from the oscillation start of the pulse laser beam and thereafter the strobe light source 541 is actuated every 100 microseconds to irradiate the semiconductor wafer 10 held by the chuck table 36 with white light WL. Therefore, light from the region processed by the pulse laser beam with which the semiconductor wafer 10 held by the chuck table 36 is irradiated immediately before (10 microseconds before) the irradiation with the white light WL is led to the imaging means 56 via the collecting lens 521, the dichroic mirror 53, and the beam splitter 55.

Figure 8A:
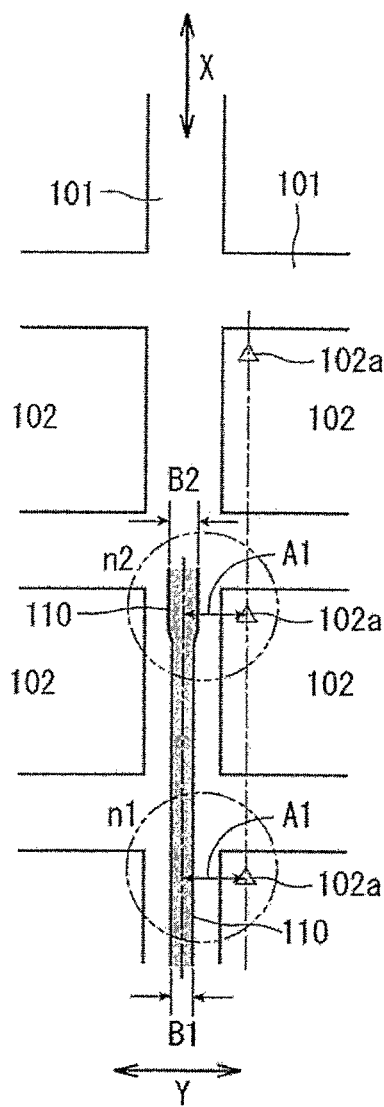
FIG. 8A and FIG. 8B are explanatory diagrams of a laser-processed groove monitoring step carried out by the laser processing apparatus depicted in FIG. 1.

The light led to the imaging means 56 is subjected to image forming on the imaging element (CCD) 562 via the compound lens 561 including the aberration correction lens 561a and the image forming lens 561b. Then, the imaging element (CCD) 562 sends an image signal obtained by the image forming to the control means 7. The control means 7 stores the image signal sent from the imaging element (CCD) 562 every 100 microseconds in this manner in the random access memory (RAM) 73. FIG. 8A depicts the laser-processed groove 110 formed by the pulse laser beam with which the semiconductor wafer 10 held by the chuck table 36 is irradiated along the planned dividing line 101 of the semiconductor wafer 10, and a first taken image n1 and a second taken image n2 sent from the imaging element (CCD) 562. In the embodiment depicted in FIG. 8A, a target 102a is set at a predetermined position in each of the respective devices 102 formed on the semiconductor wafer 10 and the Y-axis direction distance from this target 102a to the center of the adjacent planned dividing line 101 (processing position) is set to A1 (for example 300 μm). Furthermore, the width of the laser-processed groove 110 formed by the irradiation with the pulse laser beam is set to B1 (for example 10 μm). In the embodiment depicted in FIG. 8A, the state in which the Y-axis direction distance A1 from the target 102a to the center of the laser-processed groove 110 (processing position) is detected and the width B1 of the laser-processed groove 110 formed by the irradiation with the pulse laser beam is detected in the first taken image n1 is depicted. Furthermore, the state in which the Y-axis direction distance A1 from the target 102a to the center of the laser-processed groove 110 (processing position) is detected and a width B2 of the laser-processed groove 110 formed by the irradiation with the pulse laser beam is detected in the second taken image n2 is depicted.

If the width of the laser-processed groove 110 is detected as B1 (set value: 10 μm) in the first taken image n1 and the width B2 of the laser-processed groove 110 detected in the second taken image n2 is different from the set value (10 μm) as depicted in FIG. 8A, the control means 7 checks whether or not the width B2 of the laser-processed groove 110 is within an allowable range (for example, set value: 10 μm±2 μm). Then, the control means 7 continues the laser processing if the width B2 of the laser-processed groove 110 is within the allowable range (set value: 10 μm±2 μm), and stops the actuation of the laser beam irradiating means 5 to suspend the laser processing if the width B2 of the laser-processed groove 110 is outside the allowable range (set value: 10 μm±2 μm). For example, if the width B2 of the laser-processed groove 110 is 11 μm, the control means 7 continues the laser processing because the width B2 is within the allowable range (set value: 10 μm±2 μm). If the width B2 of the laser-processed groove 110 is 13 μm, the control means 7 stops the actuation of the laser beam irradiating means 5 to suspend the laser processing because the width B2 is outside the allowable range (set value: 10 μm±2 μm). Therefore, the lowering of the quality due to the continuation of the laser processing in the state in which the width of the laser-processed groove 110 is outside the allowable range can be prevented.

Next, an embodiment depicted in FIG. 8B will be described. In the embodiment depicted in FIG. 8B, the state in which the Y-axis direction distance A1 (set value: 300 μm) from the target 102a to the center of the laser-processed groove 110 (processing position) is detected and the width B1 (set value: 10 μm) of the laser-processed groove 110 formed by the irradiation with the pulse laser beam is detected in the first taken image n1 is depicted. Furthermore, the state in which a Y-axis direction distance A2 from the target 102a to the center of the laser-processed groove 110 (processing position) is detected and the width B1 (set value: 10 μm) of the laser-processed groove 110 formed by the irradiation with the pulse laser beam is detected in the second taken image n2 is depicted.

Figure 8B:
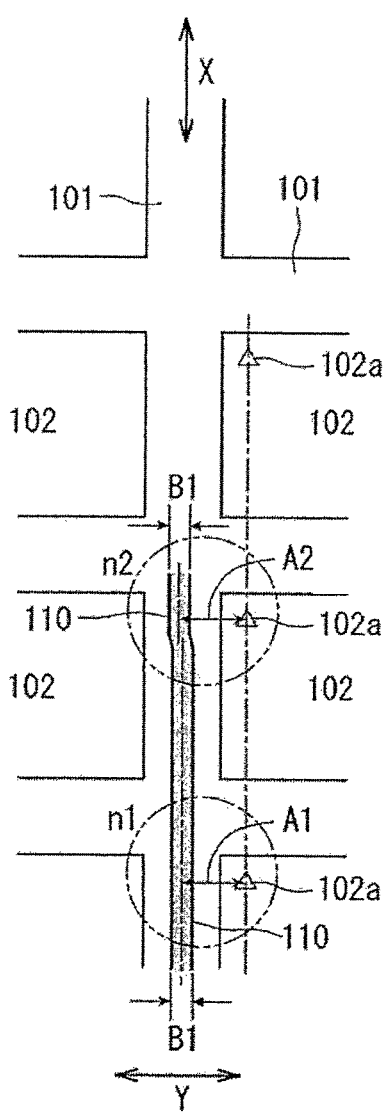

If the Y-axis direction distance A1 (set value: 300 μm) from the target 102a to the center of the laser-processed groove 110 (processing position), detected in the first taken image n1, is different from the Y-axis direction distance A2 from the target 102a to the center of the laser-processed groove 110 (processing position), detected in the second taken image n2, as depicted in the above-described FIG. 8B, the control means 7 obtains the amount of deviation between the Y-axis direction distance A2 and the Y-axis direction distance A1 (set value: 300 μm) (absolute value of A2−A1) and checks whether or not the amount of deviation (absolute value of A2−A1) is equal to or smaller than an allowable value (for example 10 μm). Then, the control means 7 continues the laser processing if the amount of deviation (absolute value of A2−A1) is equal to or smaller than the allowable value (10 μm), and controls the Y-axis direction moving means 38 to correct the irradiation position of the pulse laser beam emitted from the condenser 52 of the laser beam irradiating means 5 if the amount of deviation (absolute value of A2−A1) surpasses the allowable value (10 μm). For example, if the Y-axis direction distance A2 from the target 102a to the center of the laser-processed groove 110 (processing position) is 309 μm, the control means 7 continues the laser processing because the amount of deviation is 9 μm (309 μm-300 μm) and is smaller than the allowable value (10 μm). On the other hand, if the Y-axis direction distance A2 from the target 102a to the center of the laser-processed groove 110 (processing position) is 320 μm, the amount of deviation is 20 μm (320 μm-300 μm) and surpasses the allowable value (10 μm). Thus, the control means 7 controls the Y-axis direction moving means 38 to correct the irradiation position of the pulse laser beam emitted from the condenser 52 of the laser beam irradiating means 5 so that the Y-axis direction distance from the target 102a to the center of the laser-processed groove 110 (processing position) may become the set value (300 μm). At this time, the control means 7 controls the Y-axis direction moving means 38 on the basis of a detection signal from the Y-axis direction position detecting means 384.

The present invention is not limited to the details of the above described preferred embodiments. The scope of the invention is defined by the appended claims and all changes and modifications as fall within the equivalence of the scope of the claims are therefore to be embraced by the invention.

What is claimed is:
1. A laser processing apparatus comprising:
a chuck table that holds a workpiece;
laser beam irradiating means that irradiates the workpiece held by the chuck table with a pulse laser beam;
X-axis direction moving means that moves the chuck table and the laser beam irradiating means relatively in an X-axis direction that is a processing feed direction;
Y-axis direction moving means that moves the chuck table and the laser beam irradiating means relatively in a Y-axis direction that is an indexing feed direction orthogonal to the X-axis direction; and control means that controls the laser beam irradiating means, the X-axis direction moving means, and the Y-axis direction moving means, wherein the laser beam irradiating means includes
pulse laser beam oscillating means that oscillates the pulse laser beam,
a condenser that condenses the pulse laser beam oscillated from the pulse laser beam oscillating means and emits the pulse laser beam to the workpiece held by the chuck table,
a dichroic mirror that is disposed between the pulse laser beam oscillating means and the condenser and reflects the pulse laser beam oscillated from the pulse laser beam oscillating means to lead the pulse laser beam to the condenser, the dichroic mirror allowing transmission of light having a wavelength other than a wavelength of the pulse laser beam through the dichroic mirror,
strobe light irradiating means that emits light to a path on which the dichroic mirror and the condenser are disposed,
a beam splitter that is disposed between the strobe light irradiating means and the dichroic mirror and splits light from the workpiece held by the chuck table, and
imaging means disposed on a path of light split by the beam splitter, and the control means actuates the strobe light irradiating means and the imaging means according to timing of the pulse laser beam that is oscillated by the pulse laser beam oscillating means and is emitted to the workpiece held by the chuck table, and detects width of a laser-processed groove immediately after emission of the pulse laser beam on the basis of an image signal from the imaging means.

2. The laser processing apparatus according to claim 1, wherein the control means stops actuation of the laser beam irradiating means to suspend processing if the detected width of the laser-processed groove is outside an allowable range.

3. The laser processing apparatus according to claim 1, wherein the control means detects, on the basis of an image signal from the imaging means, the amount of deviation between a set value of Y-axis direction distance from a target that is set on the workpiece and is to identify a region in which processing should be carried out to the center of a laser-processed groove to be formed and Y-axis direction distance to the center of a laser-processed groove formed by irradiation with the pulse laser beam.

4. The laser processing apparatus according to claim 3, wherein the control means controls the Y-axis direction moving means to correct a position irradiated with the pulse laser beam if the amount of deviation between the set value and the Y-axis direction distance to the center of the laser-processed groove formed by irradiation with the pulse laser beam surpasses an allowable value.

* * * * *